United States Patent
Scafati

[19]

[11] Patent Number: 6,127,660
[45] Date of Patent: Oct. 3, 2000

[54] HEATED MICROCELL BASE STATION

[75] Inventor: Lee Stuart Scafati, Denville, N.J.

[73] Assignee: Lucent Technologies, Inc., Murray Hill, N.J.

[21] Appl. No.: 09/224,715

[22] Filed: Dec. 31, 1998

[51] Int. Cl.[7] .................................................. H05B 3/02
[52] U.S. Cl. ............................................ 219/486; 219/209
[58] Field of Search .................................... 219/209, 210, 219/385, 401, 407, 520, 521, 524, 525, 530, 531, 532, 538, 539, 540, 541, 542, 543, 544, 546, 547, 553, 486

[56] References Cited

U.S. PATENT DOCUMENTS

| | | | |
|---|---|---|---|
| 3,800,123 | 3/1974 | Maahs | 219/407 |
| 3,816,702 | 6/1974 | Green | 219/209 |
| 3,829,654 | 8/1974 | Eisler | 219/521 |
| 4,039,775 | 8/1977 | Andra | 219/385 |
| 4,374,316 | 2/1983 | Inamore et al. | 219/530 |
| 4,404,459 | 9/1983 | Harton | 219/209 |
| 4,430,557 | 2/1984 | Eichelberger et al. | 219/401 |
| 4,532,414 | 7/1985 | Shah et al. | 219/524 |
| 4,684,783 | 8/1987 | Gore | 219/210 |
| 5,585,024 | 12/1996 | Kosugi | 219/209 |
| 5,919,383 | 7/1999 | Beguin et al. | 219/385 |
| 5,932,128 | 8/1999 | Dishop | 219/209 |

OTHER PUBLICATIONS

Rajan Kuruppillai et al., Wireless PCS, 1997, p. 377.

*Primary Examiner*—Teresa Walberg
*Assistant Examiner*—Fadi H. Dahbour

[57] ABSTRACT

A housing for a microcell base station is provided that includes independent, selectively controlled heating elements for maintaining a desired range of operational temperatures within the housing. In particular, temperatures within the housing are sensed at different regions so as to provide a more accurate sensing of the temperature within the housing for independent control of the heating elements, despite hot or cold spots in the housing or the like.

29 Claims, 3 Drawing Sheets

HEATED MICROCELL BASE STATION

BACKGROUND OF THE INVENTION

1. Field of the Invention

The present invention relates to housings for small base stations used in cellular communication (frequently known as "microcells").

2. Description of Related Art

Cellular wireless communication is based on the use of base stations in respective geographical cells to transmit and receive calls. "Macrocells" range in size from tens of miles in rural areas to a mile or less in more metropolitan regions. However, traffic density can foreseeably become so high that a cell with even a one mile radius can become overloaded. Accordingly, much smaller cells ("microcells") are used and have coverage regions of tens of yards to hundreds of yards in radius. (See, for example, Kuruppillai et al., *Wireless PCS*, McGraw-Hill, 1997, p. 377.)

Physically, a microcell base station is relatively small (especially compared to the antenna towers of macrocells). A housing for a microcell base station may, for example, be 10 inches deep, 24 inches wide, and 24 inches high. The microcell base station comprises a housing for electronics and circuitry conventionally known in the field of cellular communication.

To the extent that microcell base stations are frequently located outdoors, it is important to maintain a particular operating temperature range within the base station housing, at least so the electronic elements therein are not unduly affected by variations in ambient temperature. For example, electric resistance in electronic components is very temperature dependent.

Conventionally, housings for microcell base stations have addressed issues of cooling, utilizing, for example, convection cooling, heat sink behavior based on metal materials used for the housing, and heat transfer fins to facilitate heat dispersion.

The issue of heating such housings has been known relative to air-cooled housings where heaters and fans to move heated air are provided. However, in convection-cooled housings, heating has not been heretofore provided.

SUMMARY OF THE INVENTION

The present invention therefore provides a housing for a microcell base station including heating elements in separated regions (for example, adjacent the door of the housing and adjacent the interior of a main body of the housing). The heating elements according to the present invention are selectively and independently operated in accordance with temperatures measured in the separated regions by respective temperature sensors. This advantageously permits more accurate consideration of the overall temperature within the housing, and avoids temperature control based on hot or cold spots within the housing.

BRIEF DESCRIPTION OF THE DRAWINGS

The present invention will be described hereinbelow with reference to the figures appended hereto, in which.

In some figures (especially FIGS. 1 and 2), some detail (e.g., of the connections between elements) is omitted for clarity.

DETAILED DESCRIPTION OF THE PRESENTLY PREFERRED EMBODIMENTS

Figure 1:
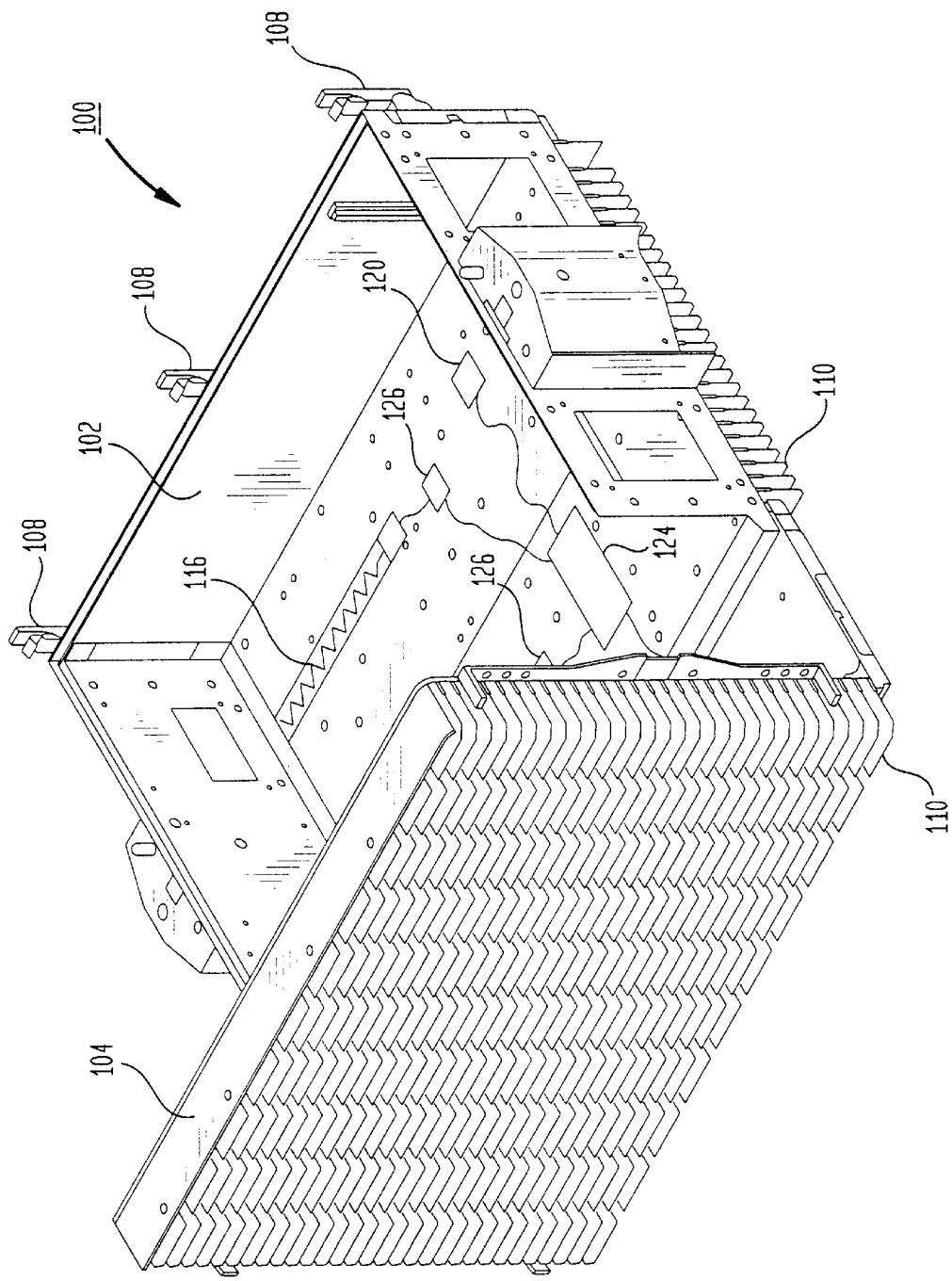
FIG. 1 is a perspective view of a microcell base station housing in an open state.

FIG. 1 is a perspective view of an open microcell base station housing 100. FIG. 1 is discussed here primarily for the purpose of explaining the overall structure of the housing according to the present invention. Generally, the box-shaped housing 100 includes a main body 102 having a space defined therein and an open side, and a door 104 attached to the main body for closing off the open side of the main body.

The main body 102 and the door 104 are both made from any structurally suitable material, including without limitation metal or plastic. One or both of the main body 102 and door 104 are provided with a heat conductive portion acting as a heat sink for conducting heat between the interior of the housing 100 and the exterior thereof, although the remainder of each structure may be, for example, thermally insulating.

In a particular embodiment of the present invention, the entire main body 102 and/or the entire door 104 act as heat sinks. In this regard, the entire main body 102 and/or entire door 104 are made from a heat conductive material, especially a metal material. The main body 102 and door 104 may be made from different materials, but for the sake of manufacturing convenience, for example, both may be made from the same material. Accordingly, the main body 102 and door 104 may be made from, for example, aluminum by any known and suitable conventional manufacturing process.

Although the door 104 may be completely separable from the main body 102, the door 104 is conveniently attached by hinges 106 to the main body (see, for example, FIG. 3), so as to selectively close the open side of the main body 102. The thusly hinged door 104 may be held in place by a conventional mechanical hasp, clip, etc. arrangement, such as the hasp arrangement 108 shown in FIGS. 1–3. Although not shown here, the door 104 may be lockable for security purposes, either with a built-in lock assembly (which may be, for example, mechanical or electronically operated in a known manner), or with a conventional external lock, such as a padlock, neither of which are shown here for simplicity.

Figure 2:
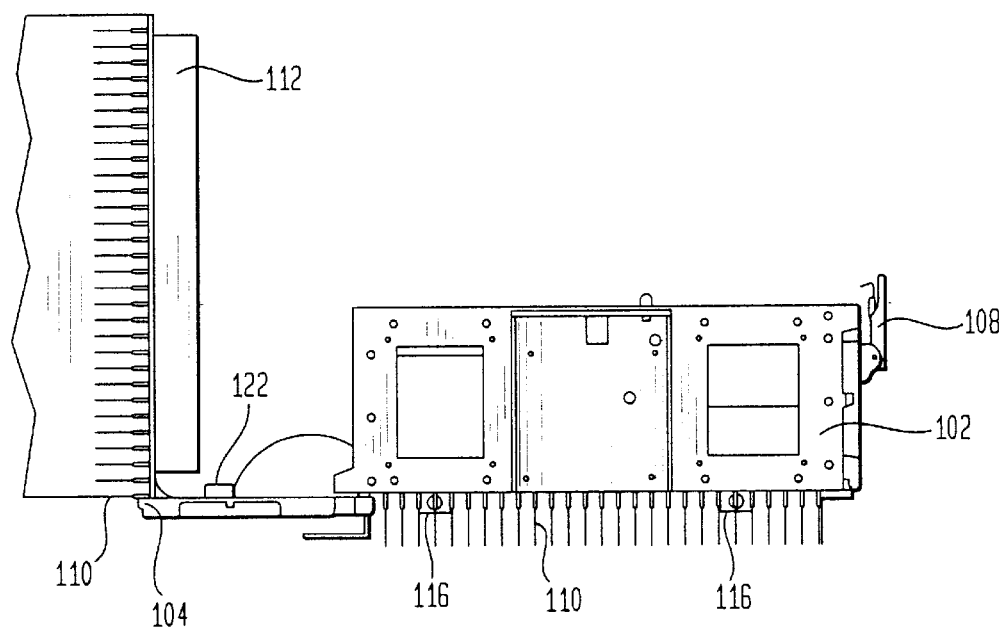
FIG. 2 is an end view of the housing according to the present invention in an open state and including heating elements provided in thermal contact with the main body of the housing.
Figure 3:
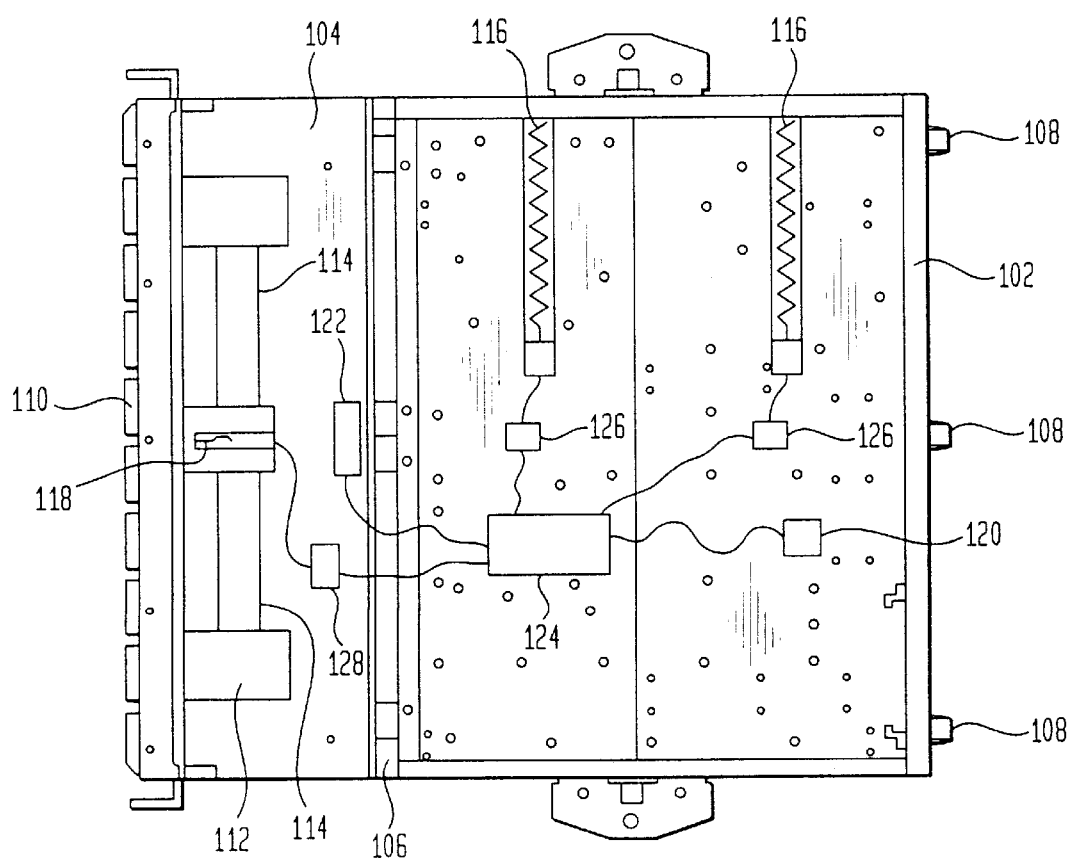
FIG. 3 is a top view of a housing according to the present invention in an open state, illustrating heating elements provided in thermal contact with the main body of the housing and with the door of the housing.
Figure 4:
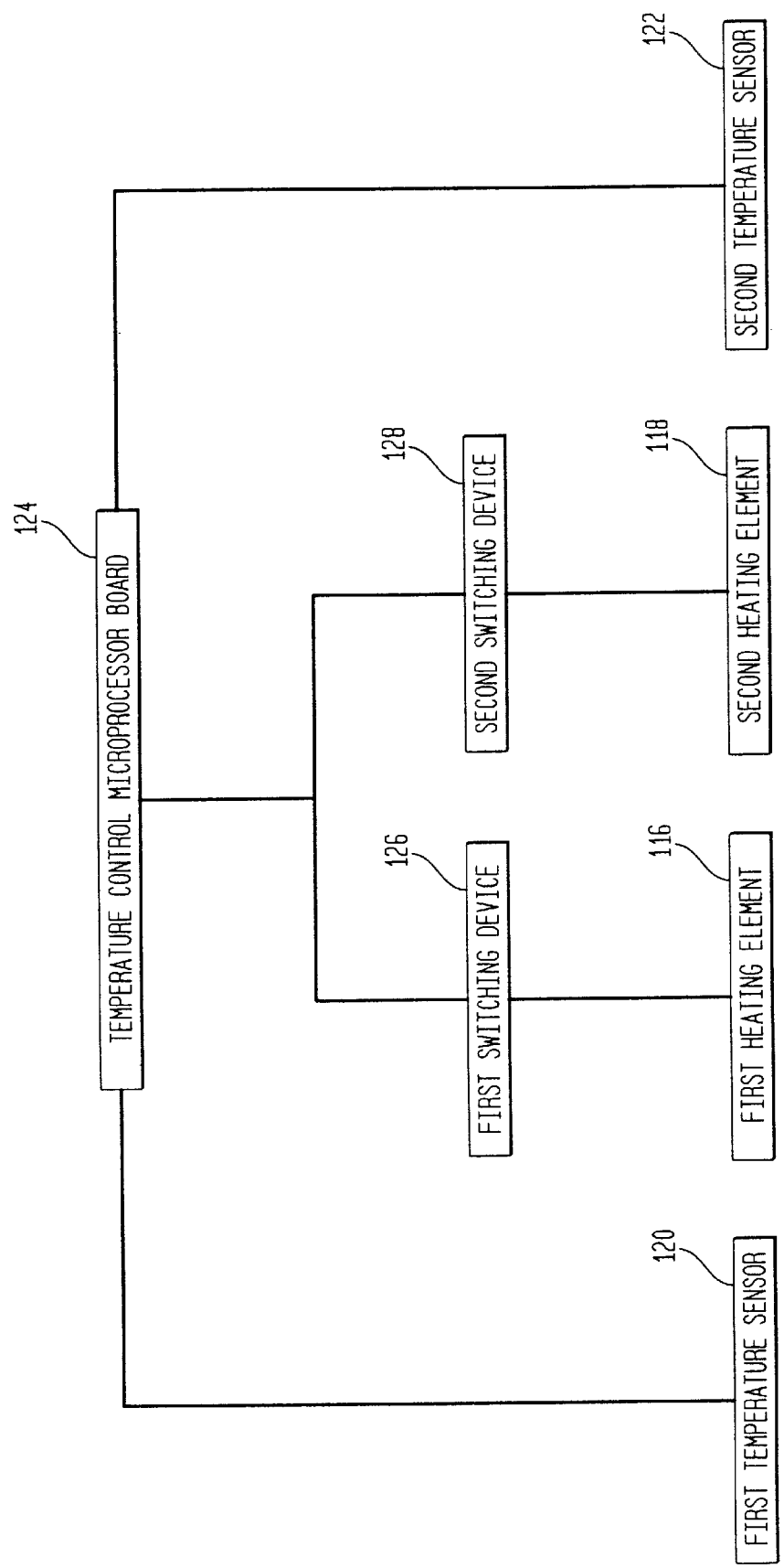
FIG. 4 is a block diagram illustrating a control system for independent control of the heating elements provided in the apparatus according to the present invention.

One or both of the main body 102 and the door 104 may optionally be provided with heat conducting fins 110, as seen in FIGS. 1–3. The heat conducting fins 110 are formed in any known manner, such as individually forming metal fins and attaching them to the exterior of the main body 102 and/or door 104 by brazing or the like.

The space defined in the main body 102 is configured to have circuit boards and other electronics mounted therein and the interior of the door 104 is configured to have circuit boards and other electronics mounted thereon. In a preferred embodiment of the present invention the circuit boards are in thermal contact with the main body 102 and door 104.

With regard to the main body 102, circuit boards (not shown here) may be arranged in parallel with the interior surface of the main body 102 so as to be in thermal contact therewith. Furthermore, it may be preferable to mount such circuit boards and electronics directly on the interior surface of main body 102 to maximize thermal conductivity effects.

The door 104 is provided with at least one (for example, three) circuit board supporting member 112. For example, circuit board supporting members 112 are, for example, spaced apart along the length of the door 104 such that spaced-apart circuit boards 114 extend therebetween, as seen especially in FIG. 3. In order to increase space efficiency, the circuit board supporting members 112 may also made from a heat conductive material, and in particular, may be made from metal.

It is within the scope of the present invention to provide at least one circuit board supporting member 112 within the main body 102 (not shown here) in addition to or in lieu of the circuit board supporting members 112 provided on door 104, and the same structural concepts associated with the circuit board supporting members as provided on door 104 apply equally.

In order to selectively provide heat, first and second heating elements generally are provided in sufficient proximity to the circuit boards so that heat from the heating elements can be transmitted to the circuit boards. In this regard, the first and second heating elements may be provided so that heat therefrom is conducted through thermally conductive portions of any of the main body 102, the door 104, and at least one of the circuit board supporting members 112. In particular, such heating elements may be placed in thermal contact with any of the main body 102, door 104, and at least one circuit board supporting member 112. A heating element may be placed against a surface of the main body 102, door 104, or the at least one circuit board supporting member 112. In addition, a heating element may disposed within a hole or bore formed in heat conductive portions of the main body 102, door 104, or the at least one circuit board supporting member 112.

Accordingly, according to one arrangement in accordance with the present invention, at least one first heating element 116 is provided in thermal contact with main body 102 (for example, along a surface (interior or exterior) of main body 102 (cf. FIGS. 1 and 3 relative to FIG. 2)), as seen in FIGS. 1–3. First heating elements 116 may alternately be disposed in bores or openings formed in a wall of main body 102 (not shown here), especially in a heat conductive portion of main body 102 (if the entire main body 102 is not made from a heat conductive material).

Likewise, as seen especially in FIG. 3, at least one second heating element 118 is disposed in a bore or opening formed in one of the circuit board supporting members 112. Again, second heating element 118 may alternately be provided, for example, in parallel contact with the circuit board supporting member 112 (not shown here).

In particular (but not exclusively), conventional, electrically-powered heater cartridges are contemplated for use as first and second heating elements 116, 118, in accordance with the present invention. Such heater cartridges are commercially available from companies such as Tempco (Part No. D9807) and Watlow.

Most generally, first and second heating elements 116, 118 may be provided in any suitable arrangement that facilitates manufacturing ease and efficiency and enhances operability. For example, one or more heating elements may be disposed within one (or more) of the circuit board supporting members 112, as seen in FIG. 3. Likewise, one or more heating elements may be placed along an interior or exterior surface of the main body 102, as seen in FIGS. 1–3. In order to protect the heating elements, they may be disposed on an interior side of the main body 102. However, they may equally be placed on an exterior of main body 102, as seen in FIG. 2, for example.

The heating elements (especially the heater cartridges) may be powered by any conventional means. Electrical power provided to the base station as a whole is a particularly convenient power source. A conventional transformer (not shown) may be provided as necessary, in this case.

The heating elements 116, 118 are controlled by respective first and second temperature sensors 120, 122 located in different (preferably, significantly spaced apart) regions within the housing 100. For example, a first temperature sensor 120 may be provided on the rearmost interior surface of the main body 102 (see, for example, FIGS. 1 and 3), while a second temperature sensor 122 may be provided on or adjacent to an interior surface of door 104 (see, for example, FIGS. 2 and 3). An intent of using such an arrangement is to avoid sensing the temperature of only a single, isolated region within the housing 100 so as to accurately provide heat to the interior, as needed.

The first and second temperature sensors 120, 122 may be of any conventional form, although durability and simplicity thereof is desirable. Accordingly, conventional thermistors, for example, are useful in the present invention.

First and second temperature sensors 120, 122 are operatively connected to a temperature control microprocessor board 124, which is suitably constructed and arranged in a known manner to provide a control signal to the first and second heating elements 116, 118 based on the temperatures sensed by the first and second temperature sensors 120, 122, respectively. It is emphasized that first heating element 116 is independently operated based on the temperature sensed by first temperature sensor 120, just as second heating element 118 is independently operated based on the temperature sensed by second temperature sensor 122.

Switching elements 126, 128, such as conventional solid-state relays may be provided operatively between the microprocessor board 124 (as seen in FIGS. 1 and 3) and the respective heating elements 116, 118, whereby the control signals from the microprocessor board 124 operate to cause the switching elements 126, 128 to selectively operate the respective heating elements 116, 118 corresponding thereto.

The microprocessor board 124 may be programmed to operate the heating elements 116, 118 if the temperature sensed by temperature sensors 120, 122 falls below a certain temperature floor, if an average of the respective sensed temperatures falls below a temperature floor, or if a certain temperature drop is measured, etc.

In one embodiment of the present invention, the microprocessor board 124 is programmed so that power is applied to the first and second heating elements 116, 118 for a preselected portion of a fixed cycle time. Accordingly, a ratio of the time period that heating elements 116, 118 are ON to the time period that heating elements 116, 118 are OFF is selected in proportion to a given target temperature that is sought to be maintained. Therefore, for example, in a ten-second cycle time, the microprocessor board 124 may be programmed to apply power to one of the heating elements for six seconds, and keep that heating element off for four seconds.

More particularly, the proportion of the time cycle in the ON state increases in relation to the target temperature, up to a 100% ON state. This, of course, must take into account the characteristic heat output of the heating element.

Thus, while there have been shown and described and pointed out fundamental novel features on the invention as applied to preferred embodiments thereof, it will be understood that various omissions and substitutions and changes in the form and details of the devices illustrated, and in their operation, and in the method illustrated and described, may be made by those skilled in the art without departing from the spirit of the invention. For example, it is expressly intended that all combinations of those elements and/or methods steps which perform substantially the same function in substantially the same way to achieve the same results are within the scope of the invention. It is the invention, therefore, to be limited only as indicated by the scope of the claims appended hereto.

What is claimed is:

1. A selectively heatable microcell base station housing comprising:
    a main body defining a space therein and having an open side;
    a door attachable to said main body so as to close off said open side of said main body;
    at least one circuit board supporting member provided on at least one of an interior side wall of said main body and an interior of said door;
    a first heating element associated with said main body;
    a second heating element associated with said door;
    a first temperature sensor provided on or adjacent to an interior surface of said main body;
    a second temperature sensor provided on or adjacent to said door; and
    a control system constructed and arranged to switch said first and second heating elements on and off independently in accordance with temperatures sensed by said first and second temperature sensors, respectively.

2. The housing according to claim 1, wherein at least a portion of one of said main body and said door is a heat sink.

3. The housing according to claim 2, wherein at least one of said main body and said door as a whole is a heat sink.

4. The housing according to claim 3, wherein both said main body and said door as a whole are heat sinks.

5. The housing according to claim 4, wherein at least one of said main body and said door are made from a metal material.

6. The housing according to claim 5, wherein said main body and said door are each made from a metal material.

7. The housing according to claim 1, wherein said main body is constructed and arranged to receive a circuit board mounted on an interior wall thereof.

8. The housing according to claim 7, wherein said at least one circuit board supporting member is adapted to mount a circuit board in thermal contact therewith.

9. The housing according to claim 1, wherein said at least one circuit board supporting member is adapted to mount a circuit board in thermal contact therewith.

10. The housing according to claim 1, wherein said at least one circuit board supporting member is made from a thermally conductive material.

11. The housing according to claim 1, wherein said door is hingedly attached to said main body so as to selectively close off said open side of said main body.

12. The housing according to claim 11, further comprising a latch for securing said hingedly attached door in a closed position relative to said main body.

13. The housing according to claim 1, wherein an exterior side of said main body is provided with at least one heat transfer fin.

14. The housing according to claim 1, wherein an exterior side of said door is provided with at least one heat transfer fin.

15. The housing according to claim 13, wherein an exterior side of said door is provided with at least one heat transfer fin.

16. The housing according to claim 1, wherein said first and second heating elements are electrically powered heater cartridges.

17. The housing according to claim 1, wherein said first heating element is mounted on an interior surface of said main body.

18. The housing according to claim 1, wherein said first heating element is mounted on an exterior surface of said main body.

19. The housing according to claim 1, wherein said second heating element is disposed within said at least one circuit board supporting member.

20. The housing according to claim 1, wherein said second heating element is disposed alongside said at least one circuit board supporting member in thermal contact therewith.

21. The housing element according to claim 1, wherein said control system comprises:
    a microprocessor constructed and arranged to receive signals corresponding to temperatures sensed by said first and second temperature sensors and to output corresponding control signals for operating said first and second heating elements; and
    first and second switching elements operatively arranged between said microprocessor and said first and second heating elements, respectively, said first and second switching elements being operable in accordance with said control signals output from said microprocessor, whereby said first and second heating elements are selectively operated.

22. The housing according to claim 1, wherein said first and second temperature sensors are thermistors.

23. The housing according to claim 21, wherein said microprocessor is constructed and arranged to operate said first and second heating elements in accordance with a comparison between a temperature sensed by said first and second temperature sensors, respectively, and a target threshold temperature.

24. The housing according to claim 21, wherein said microprocessor is constructed and arranged to operate said first heating element independently of said second heating element.

25. The housing according to claim 21, wherein said microprocessor is a pulse-width modulation controller whereby said first and second heating elements are operated for a selective portion of a fixed time cycle.

26. A selectively heatable microcell base station housing comprising:
    a main body defining a space therein and having an open side;
    a door attachable to said main body so as to close off said open side of said main body;
    at least one circuit board supporting member provided on at least one of an interior of said main body and an interior of said door, said at least one circuit board supporting member being constructed and arranged to mount a circuit board in thermal contact with said at least one circuit board supporting member;
    a first heating element associated with said main body;
    a second heating element associated with said door;
    a first temperature sensor provided on or adjacent to an interior surface of said main body;
    a second temperature sensor provided on or adjacent to said door; and a control system constructed and arranged to switch said first and second heating elements on and off independently in accordance with temperatures sensed by said first and second temperature sensors, respectively.

27. The housing according to claim 26, wherein said at least one circuit board supporting member is made from a thermally conductive material.

28. A selectively heatable microcell base station housing comprising:

a main body defining a space therein and having an open side;

a door attachable to said main body so as to close off said open side of said main body;

at least one circuit board supporting member provided on at least one of an interior of said main body and an interior of said door;

at least one circuit board mounted on said at least one circuit board supporting member;

a first heating element associated with said main body;

a second heating element associated with said door;

a first temperature sensor provided on or adjacent to an interior surface of said main body;

a second temperature sensor provided on or adjacent to said door; and a control system constructed and arranged to switch said first and second heating elements on and off independently in accordance with temperatures sensed by said first and second temperature sensors, respectively.

29. The housing according to claim 28, wherein said at least one circuit board is in thermal contact with said at least one of an interior of said main body and an interior of said door.

* * * * *